United States Patent
Ugge

(10) Patent No.: US 10,643,954 B2
(45) Date of Patent: May 5, 2020

(54) MULTILAYER FRAME PACKAGES FOR INTEGRATED CIRCUITS HAVING A MAGNETIC SHIELD INTEGRATED THEREIN, AND METHODS THEREFOR

(71) Applicant: Everspin Technologies, Inc., Chandler, AZ (US)

(72) Inventor: Angelo V. Ugge, Chandler, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 16/055,470

(22) Filed: Aug. 6, 2018

(65) Prior Publication Data
US 2019/0051613 A1 Feb. 14, 2019

Related U.S. Application Data

(60) Provisional application No. 62/542,535, filed on Aug. 8, 2017.

(51) Int. Cl.
*H01L 23/552* (2006.01)
*H01L 23/498* (2006.01)
(Continued)

(52) U.S. Cl.
CPC ........ *H01L 23/552* (2013.01); *H01L 23/3157* (2013.01); *H01L 23/49534* (2013.01); *H01L 23/49866* (2013.01); *H01L 23/5226* (2013.01); *H01L 24/49* (2013.01); *H01L 23/49816* (2013.01); *H01L 23/49822* (2013.01); *H01L 24/27* (2013.01); *H01L 24/29* (2013.01); *H01L 24/32* (2013.01); *H01L 24/33* (2013.01); *H01L 24/48* (2013.01); *H01L 24/73* (2013.01); *H01L 24/83* (2013.01); *H01L 2224/2732* (2013.01); *H01L 2224/27312* (2013.01); *H01L 2224/2919* (2013.01); *H01L 2224/32225* (2013.01); *H01L 2224/33181* (2013.01); *H01L 2224/33505* (2013.01); *H01L 2224/48091* (2013.01); *H01L 2224/48227* (2013.01); *H01L 2224/48235* (2013.01); *H01L 2224/73215* (2013.01); *H01L 2224/73265* (2013.01);
(Continued)

(58) Field of Classification Search
CPC ..................................... H01L 23/552
USPC ........................................... 257/659
See application file for complete search history.

(56) References Cited

U.S. PATENT DOCUMENTS

| 6,906,396 B2 | 6/2005 | Tuttle et al. |
| 2005/0212129 A1* | 9/2005 | Huang .................... H01L 24/97 257/737 |

(Continued)

FOREIGN PATENT DOCUMENTS

JP 2005-158985 6/2005

OTHER PUBLICATIONS

International Search Report and Written Opinion of International Searching Authority, dated Nov. 20, 2018, 59 pages.

*Primary Examiner* — Ajay Arora
(74) *Attorney, Agent, or Firm* — Bookoff McAndrews, PLLC

(57) ABSTRACT

An integrated circuit package may comprise a multilayer frame package including: a bottom layer; and a magnetic shield layer, including a sub-frame and a magnetic shield disposed within a periphery of the sub-frame; and an integrated circuit die provided on or above the magnetic shield layer of the multilayer frame package.

20 Claims, 13 Drawing Sheets

(51) Int. Cl.
  *H01L 23/31*  (2006.01)
  *H01L 23/495* (2006.01)
  *H01L 23/522* (2006.01)
  *H01L 23/00*  (2006.01)

(52) U.S. Cl.
  CPC ............ *H01L 2224/83851* (2013.01); *H01L 2924/00014* (2013.01); *H01L 2924/1441* (2013.01); *H01L 2924/15311* (2013.01); *H01L 2924/3025* (2013.01)

(56) References Cited

U.S. PATENT DOCUMENTS

| | | | | |
|---|---|---|---|---|
| 2008/0157330 | A1* | 7/2008 | Kroehnert | H01L 21/4871 257/686 |
| 2010/0246771 | A1* | 9/2010 | Hawver | G03B 42/02 378/98.2 |
| 2012/0193737 | A1* | 8/2012 | Pang | H01L 21/561 257/421 |
| 2014/0198564 | A1* | 7/2014 | Guo | G11C 11/161 365/158 |
| 2015/0214104 | A1* | 7/2015 | Akahoshi | H01L 23/544 438/107 |
| 2015/0380361 | A1 | 12/2015 | Lee | |
| 2018/0351078 | A1* | 12/2018 | Bharat | H01L 24/29 |

\* cited by examiner

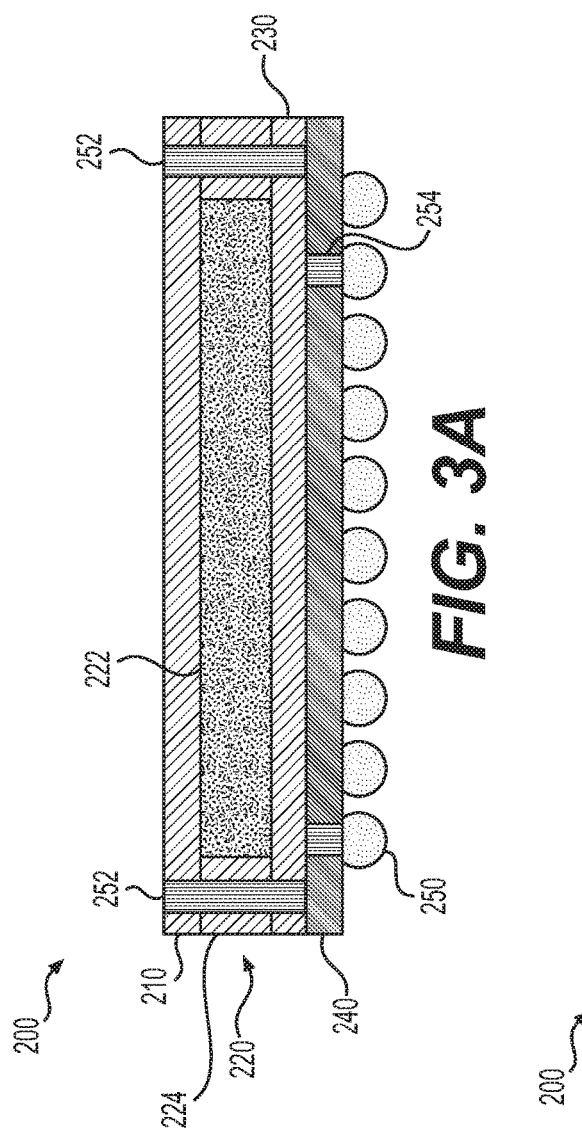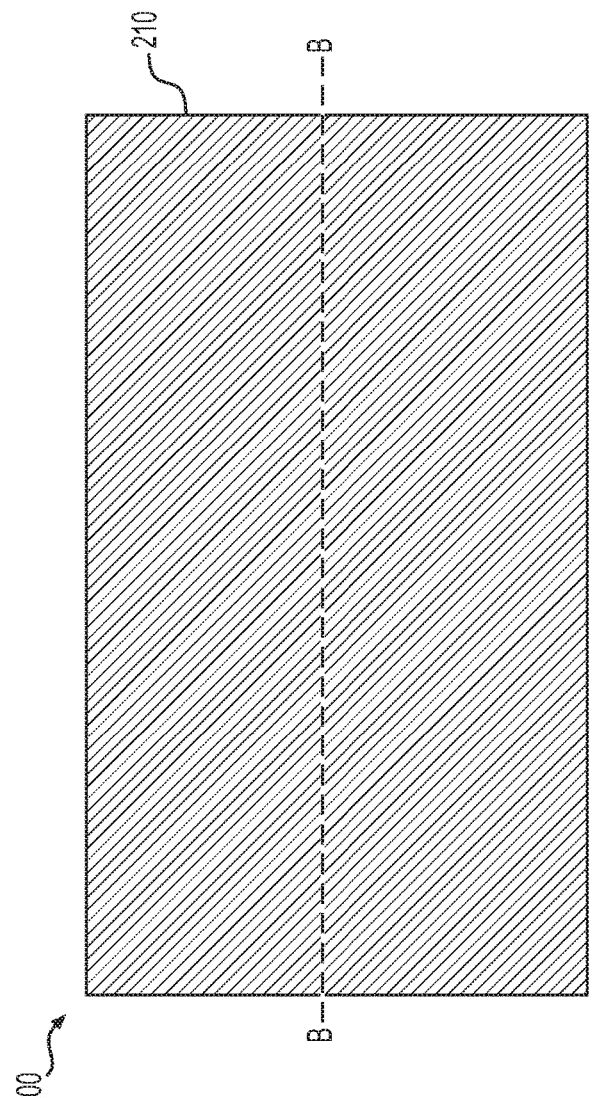
FIG. 3A
FIG. 3B

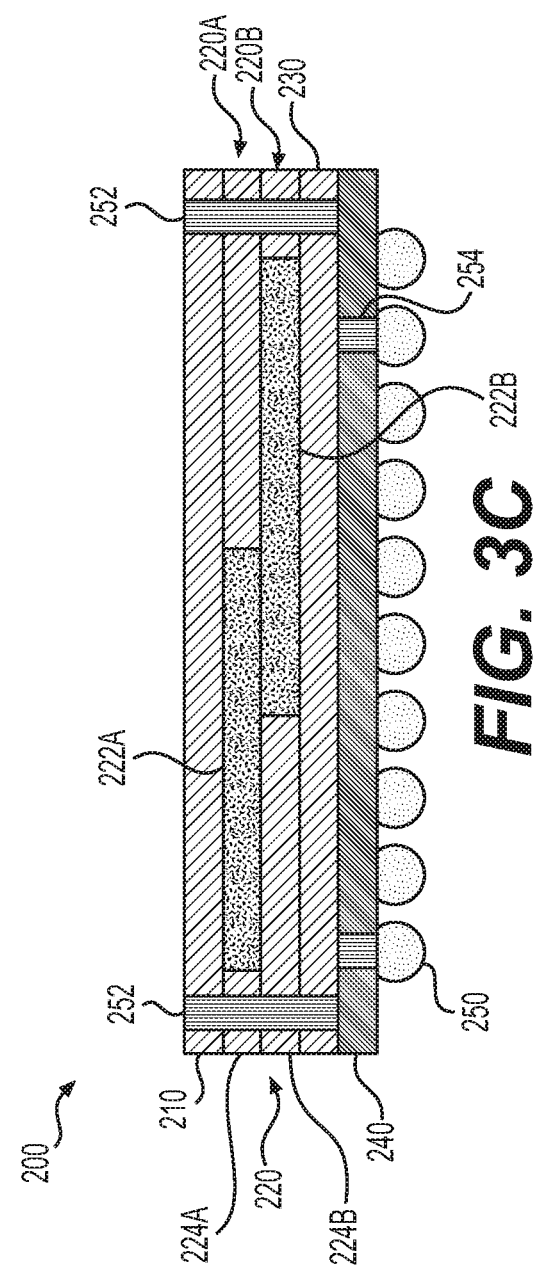

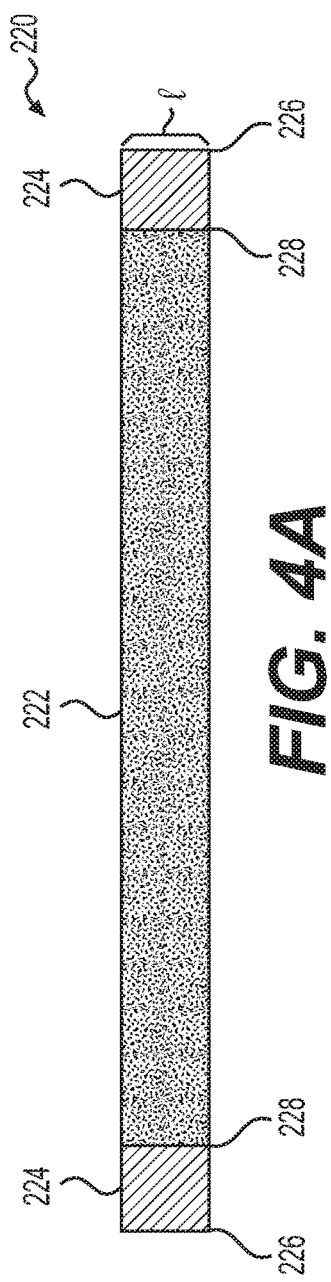
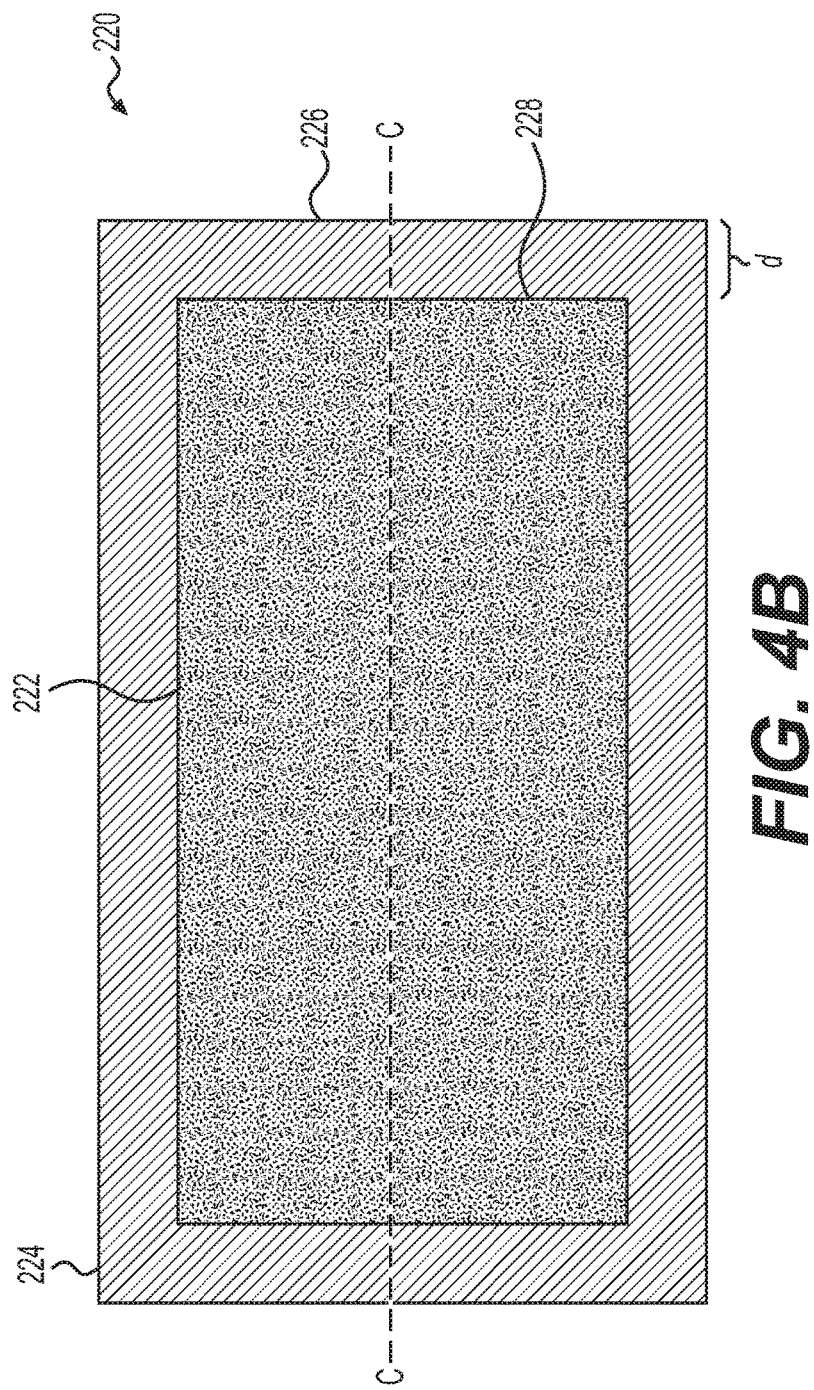

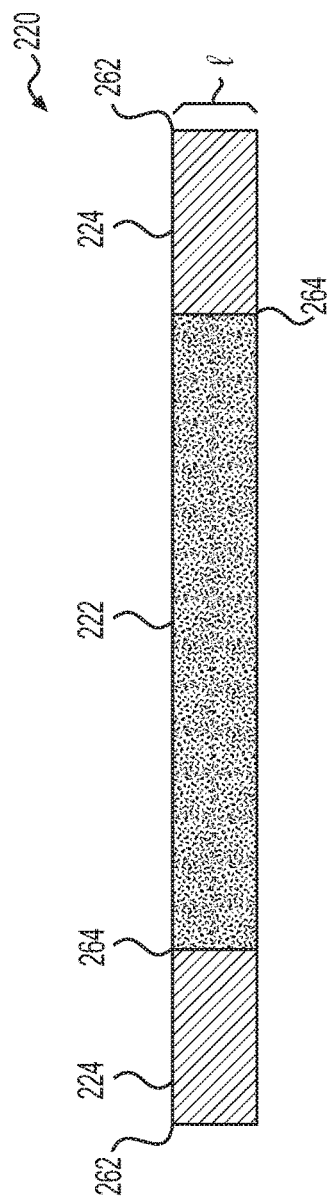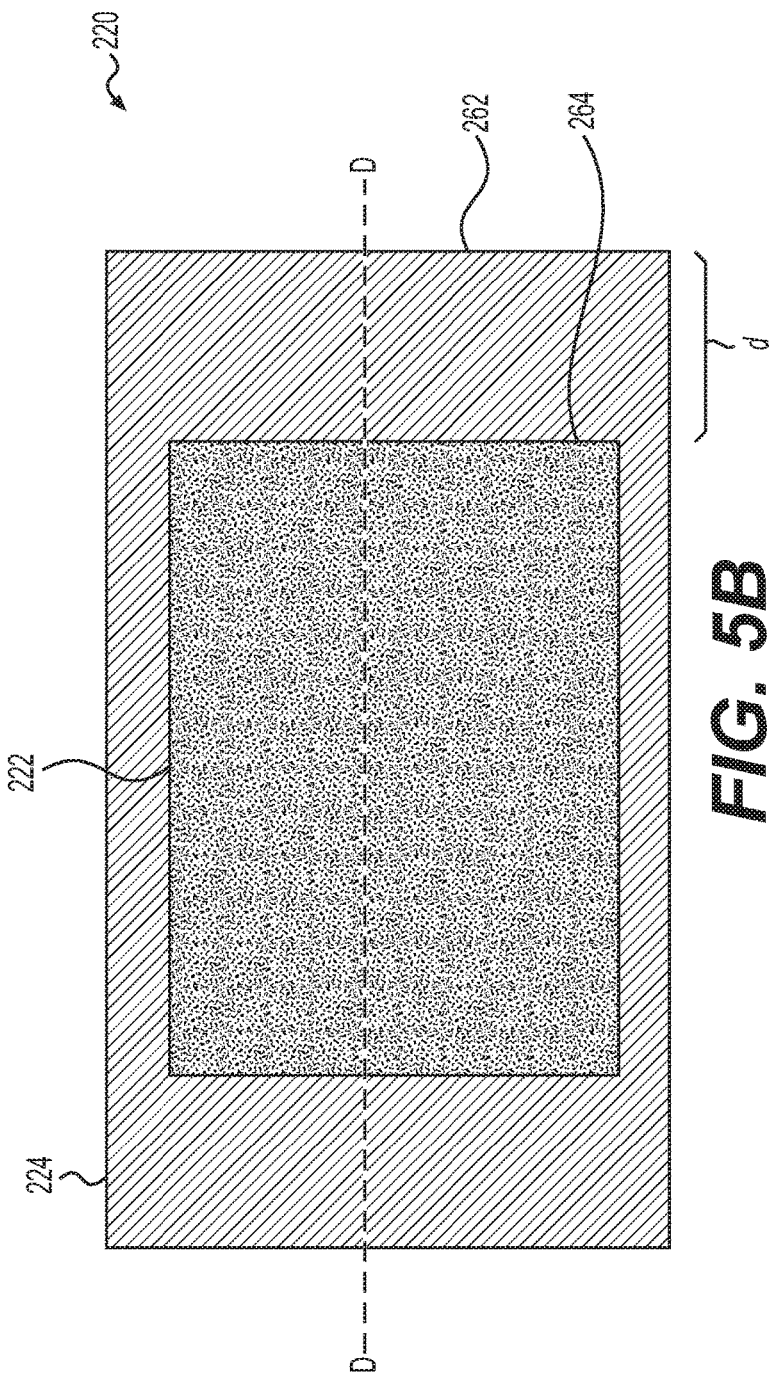

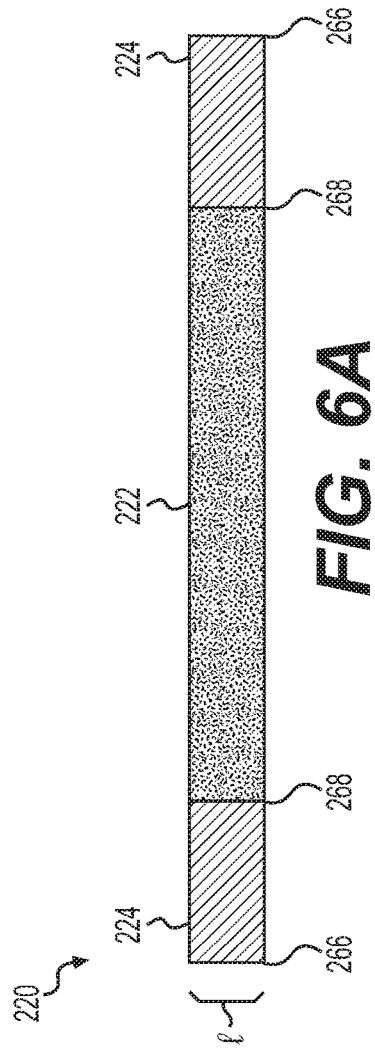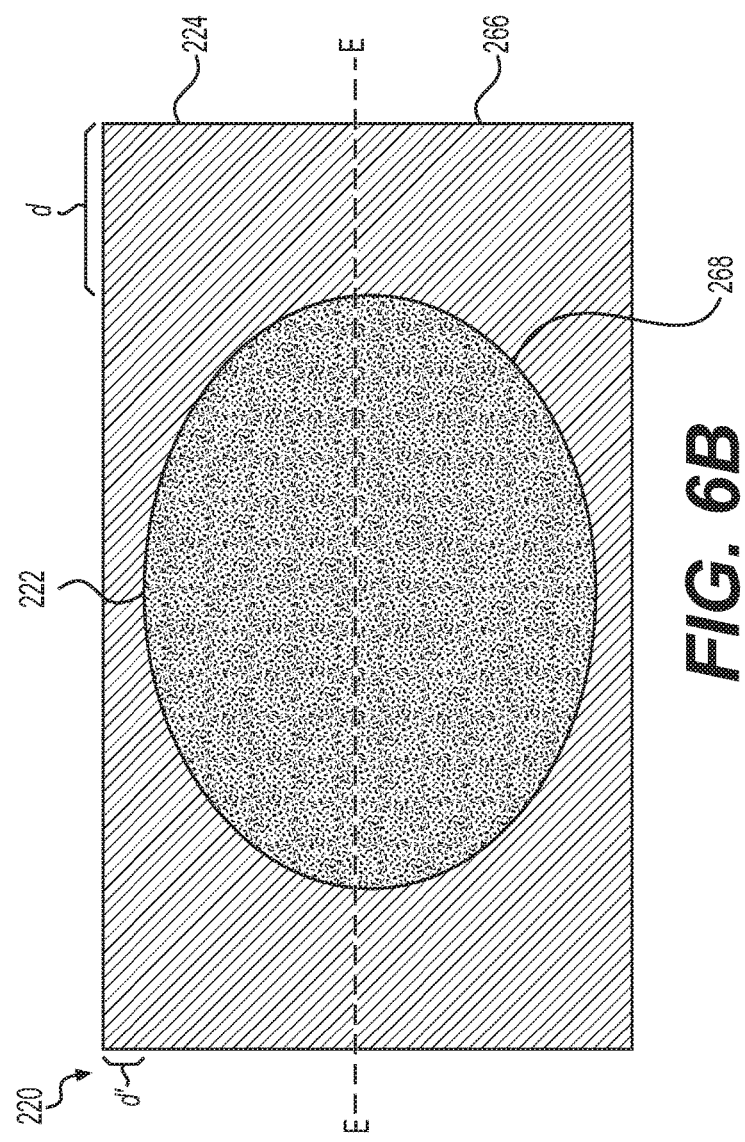

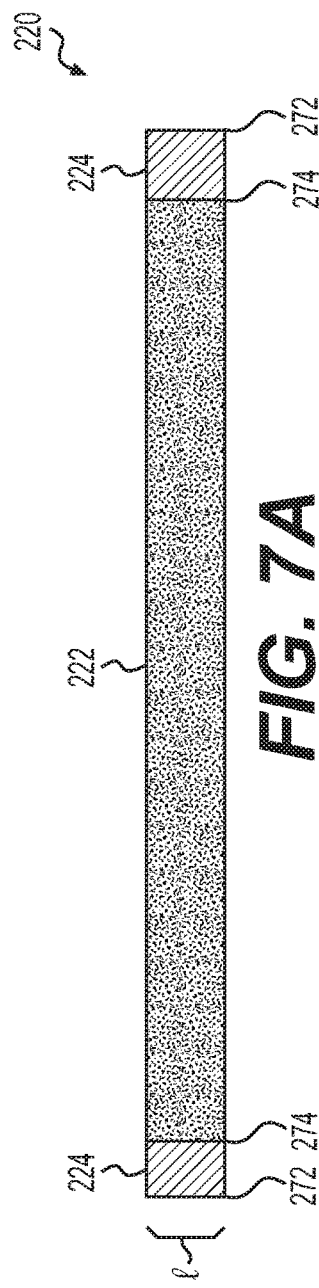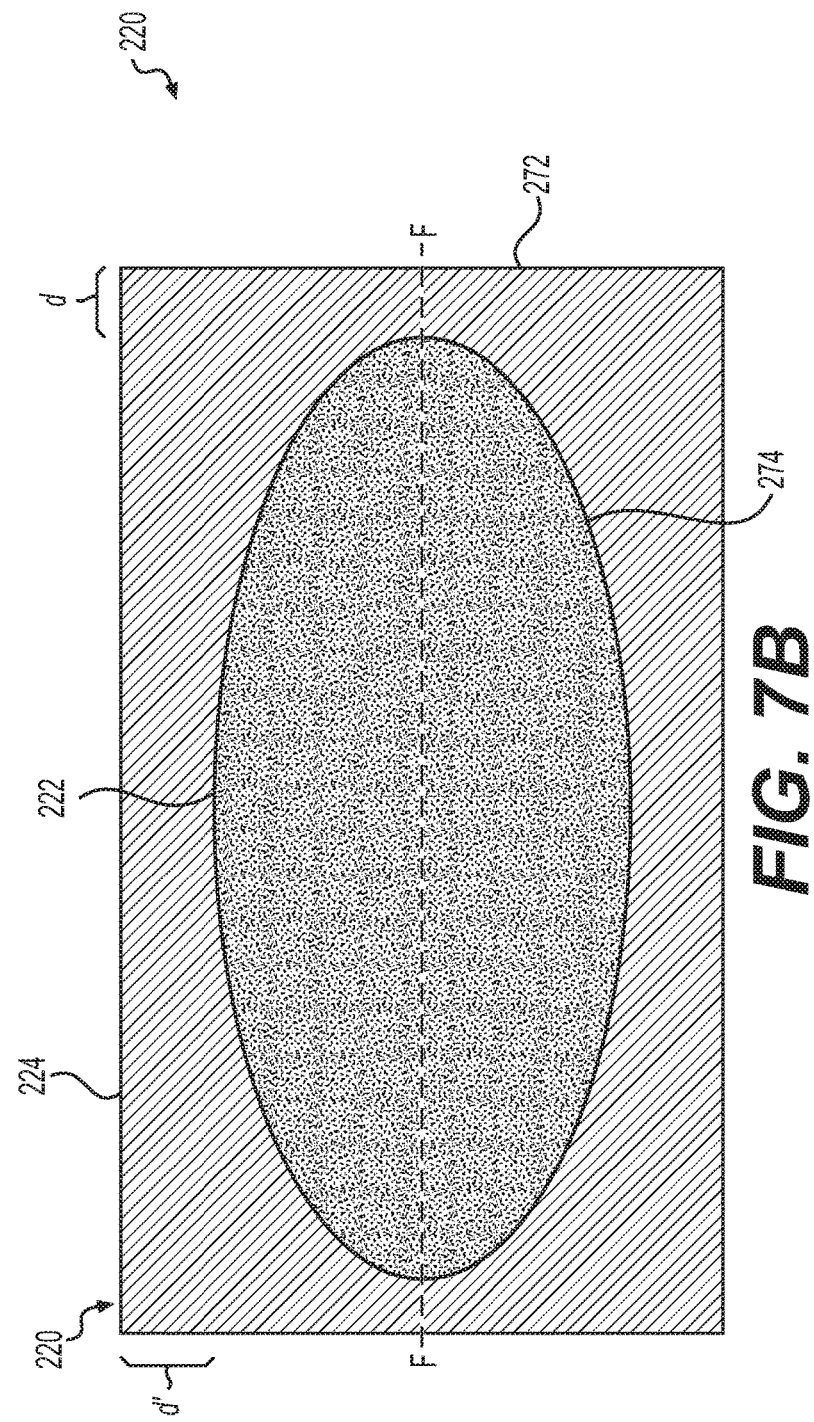

MULTILAYER FRAME PACKAGES FOR INTEGRATED CIRCUITS HAVING A MAGNETIC SHIELD INTEGRATED THEREIN, AND METHODS THEREFOR

CROSS-REFERENCE TO RELATED APPLICATIONS

This application claims the benefit of U.S. Provisional Application No. 62/542,535, filed Aug. 8, 2017, the disclosure of which is incorporated herein by reference in its entirety.

TECHNICAL FIELD

The present disclosure relates to packages for and methods of packaging integrated circuits having an integrated magnetic shield.

INTRODUCTION

An integrated circuit (IC) device includes a set of electronic circuits formed on a substrate of semiconductor material. Typically, one or more IC devices are housed in an IC package. The IC package provides mechanical and/or electrical support for the IC devices packaged therein. In general, among other functions, the IC package provides physical protection, thermal control, power supply, electromagnetic interference (EMI) shielding, and interconnection between the IC devices and the next level of assembly (e.g., motherboard, etc.). A large number of IC package types exist in industry. Non-limiting examples of package types include, but are not limited to, through-hole packages (e.g., single in-line package (SIP), dual in-line package (DIP), etc.) and surface mount packages (e.g., pin grid array (PGA), ball grid array (BGA), lead frame based packages, etc.).

Any type of IC device (e.g., microprocessors, memory devices, etc.) may be packaged in an IC package. In some applications (such as, e.g., magnetoresistive random access memory (MRAM)), the package may also shield the included device from external magnetic fields. MRAM is a non-volatile computer memory technology that relies on magnetization directions to store data. External magnetic fields (e.g., produced by cell phones, electrical transmission lines, disk drives, TVs, etc.) may interfere with the performance of an MRAM. Therefore, packages for MRAM devices may include magnetic shielding layers that reduce the effect of the external magnetic fields. Typically, in such IC packages, a metallic shield in the form of a sheet or a foil may be provided adjacent to the IC device to act as a shielding layer.

BRIEF DESCRIPTION OF THE DRAWINGS

Embodiments of the present disclosure may be implemented in connection with aspects illustrated in the attached drawings. These drawings show different aspects of the present disclosure and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure and/or manner of construction of the various described embodiments, as well as associated methods of manufacture. For ease of illustration, the figures depict the different regions along the thickness of the illustrated packages as a layer having well-defined boundaries with straight edges (e.g., depicted using lines). However, one skilled in the art would understand that, in reality, at an interface between adjacent regions or layers in the illustrated packages, the layers and/or regions may include ill-defined interfaces or boundaries. Further, although the figures illustrate each region or layer as having a relatively uniform thickness across its width, one of ordinary skill in the art would recognize that, in reality, the different regions or layers may have a non-uniform thickness (e.g., the thickness of a layer may vary along the width of the layer), and/or the thickness of one region or layer may differ relative to the thickness of another (e.g., adjacent) region or layer.

In the figures and the following description, details of well-known features (e.g., interconnects, etc.) and manufacturing techniques (e.g., deposition techniques, etching techniques, etc.) may be omitted for the sake of brevity (and to avoid obscuring other features), since these features/technique are well-known to those of ordinary skill in the art. Elements in the figures are not necessarily drawn to scale. The dimensions of some features may be exaggerated relative to other features to improve understanding of the exemplary embodiments. Cross-sectional views are simplifications provided to help illustrate the relative positioning of various regions/layers and to describe various processing steps. One skilled in the art would appreciate that the cross-sectional views are not drawn to scale and should not be viewed as representing proportional relationships between different regions/layers of the exemplary packages described herein. Moreover, while certain regions/layers and features are illustrated with straight 90-degree edges, in reality, such regions/layers may be more "rounded" and/or gradually sloping. It should also be noted that, even if it is not specifically mentioned, aspects described with reference to one embodiment may also be applicable to, and may be used with, other embodiments.

Figure 1:
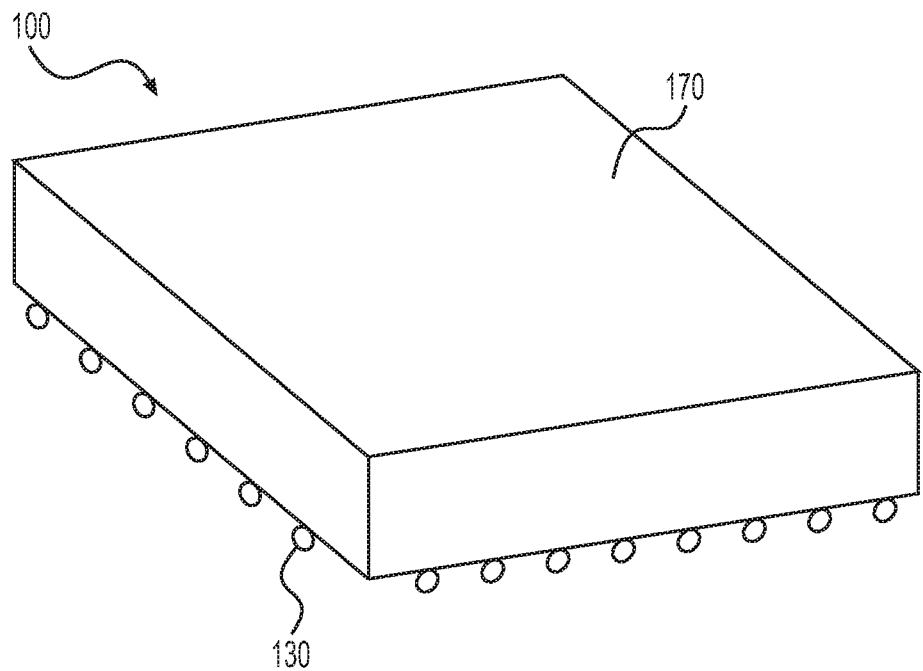
Figure 2:
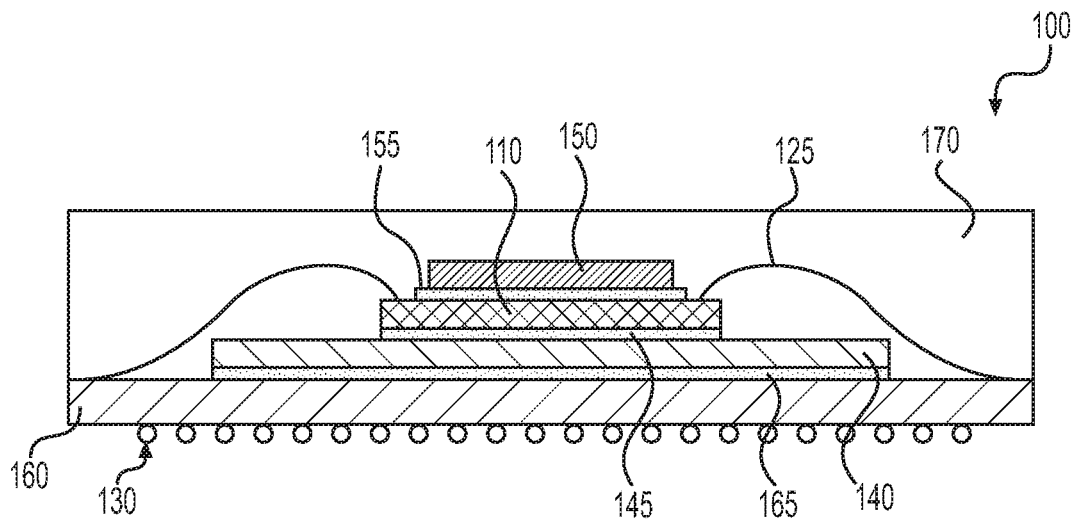

FIGS. 1-2 illustrate an exemplary IC package.

FIGS. 3A-3C are simplified schematic views of an exemplary multilayer frame package including a magnetic shield layer.

FIGS. 4A-4B, 5A-5B, 6A-6B, and 7A-7B illustrate exemplary magnetic shield layers which may be used in conjunction with the multilayer frame package of FIGS. 3A-3C.

Figure 8A:
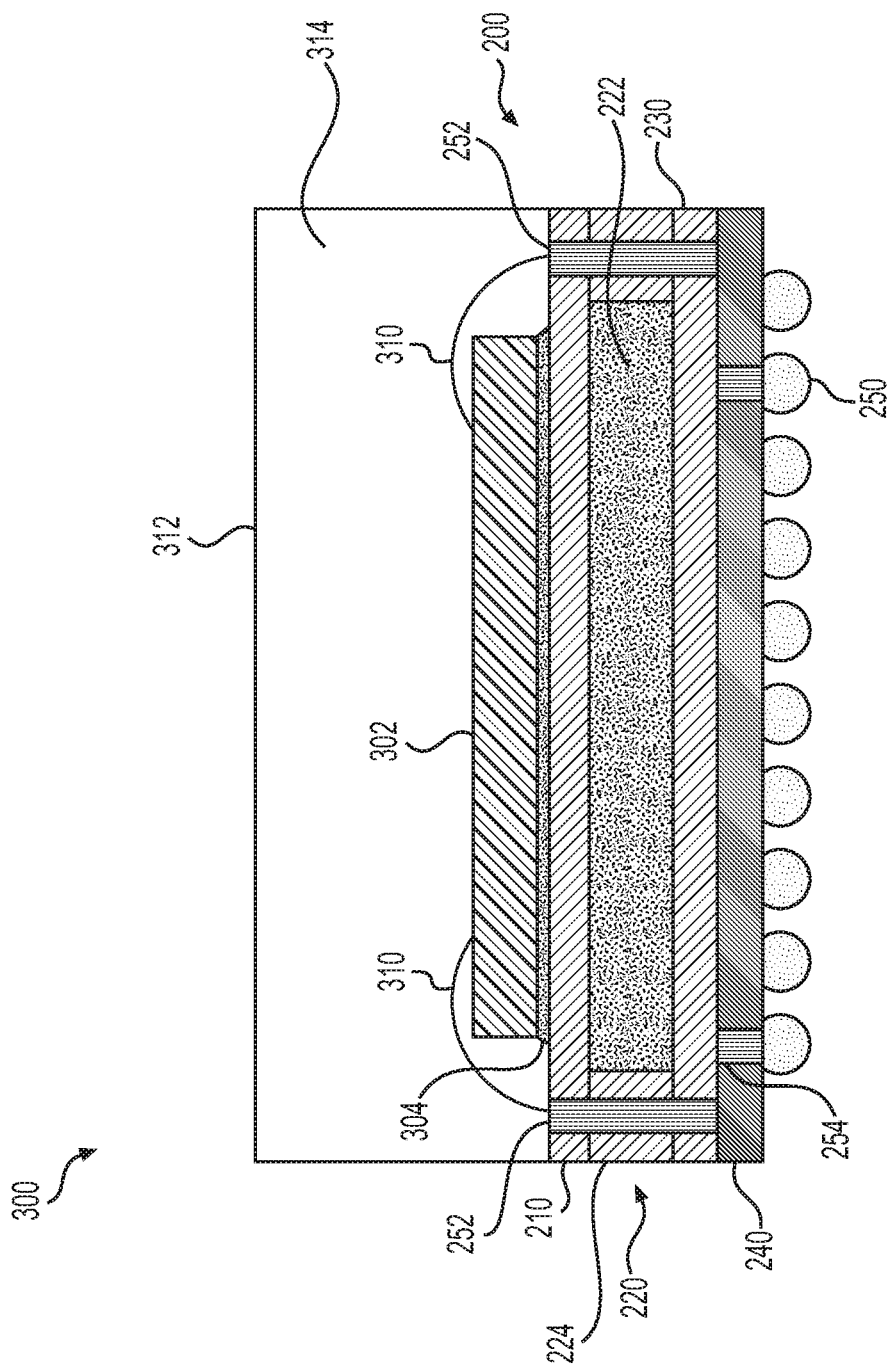

FIG. 8A is a schematic cross-sectional view of an exemplary IC package incorporating a multilayer frame package and other components.

Figure 8B:
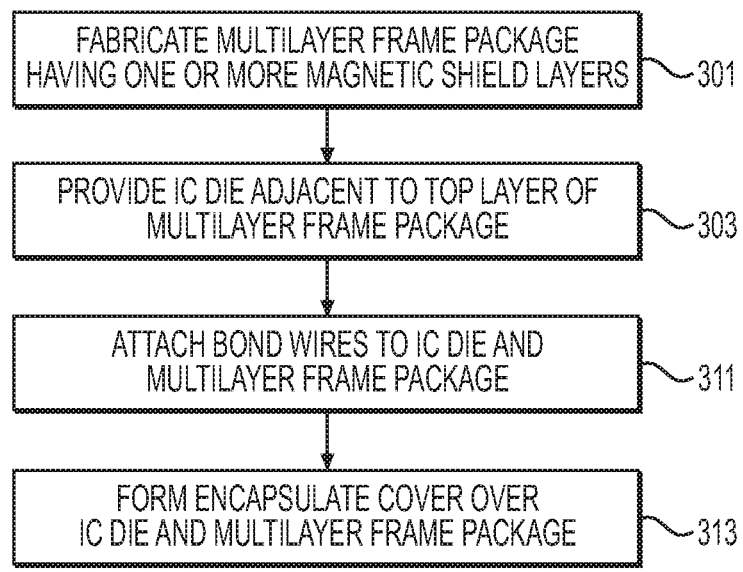

FIG. 8B is an exemplary method of manufacturing the exemplary IC package of FIG. 8A.

Figure 9A:
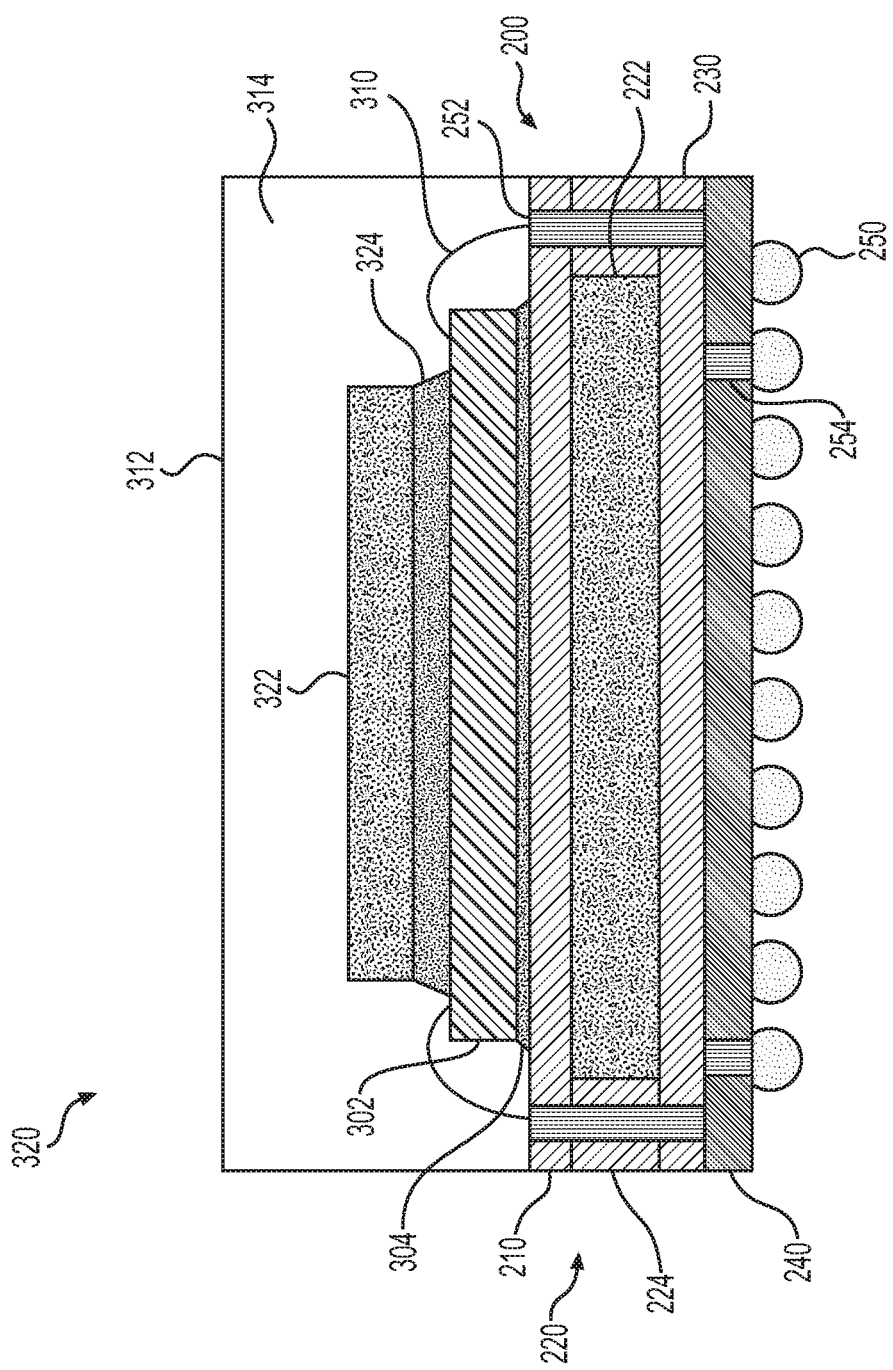

FIG. 9A is a schematic cross-sectional view of another exemplary IC package incorporating a multilayer frame package and other components.

Figure 9B:
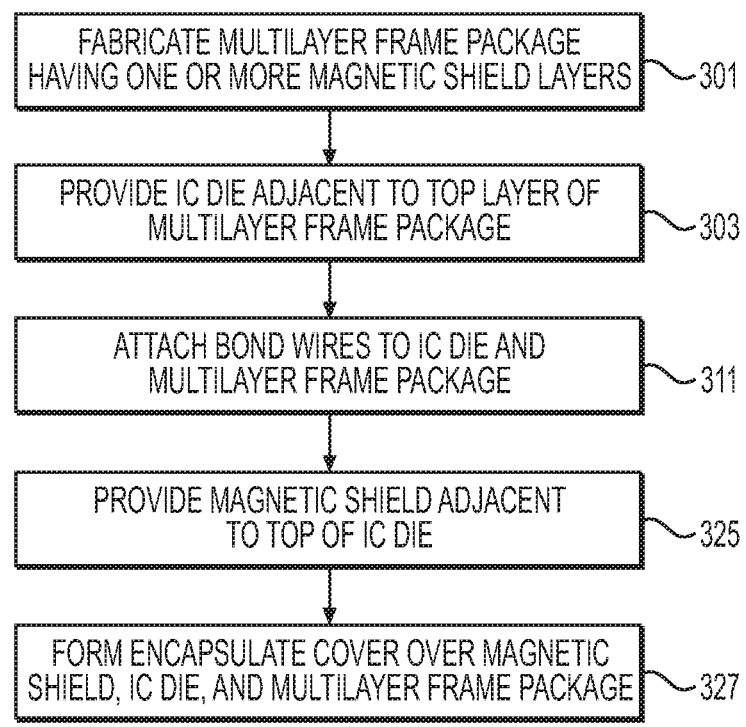

FIG. 9B is an exemplary method of manufacturing the exemplary IC package of FIG. 9A.

Figure 10:
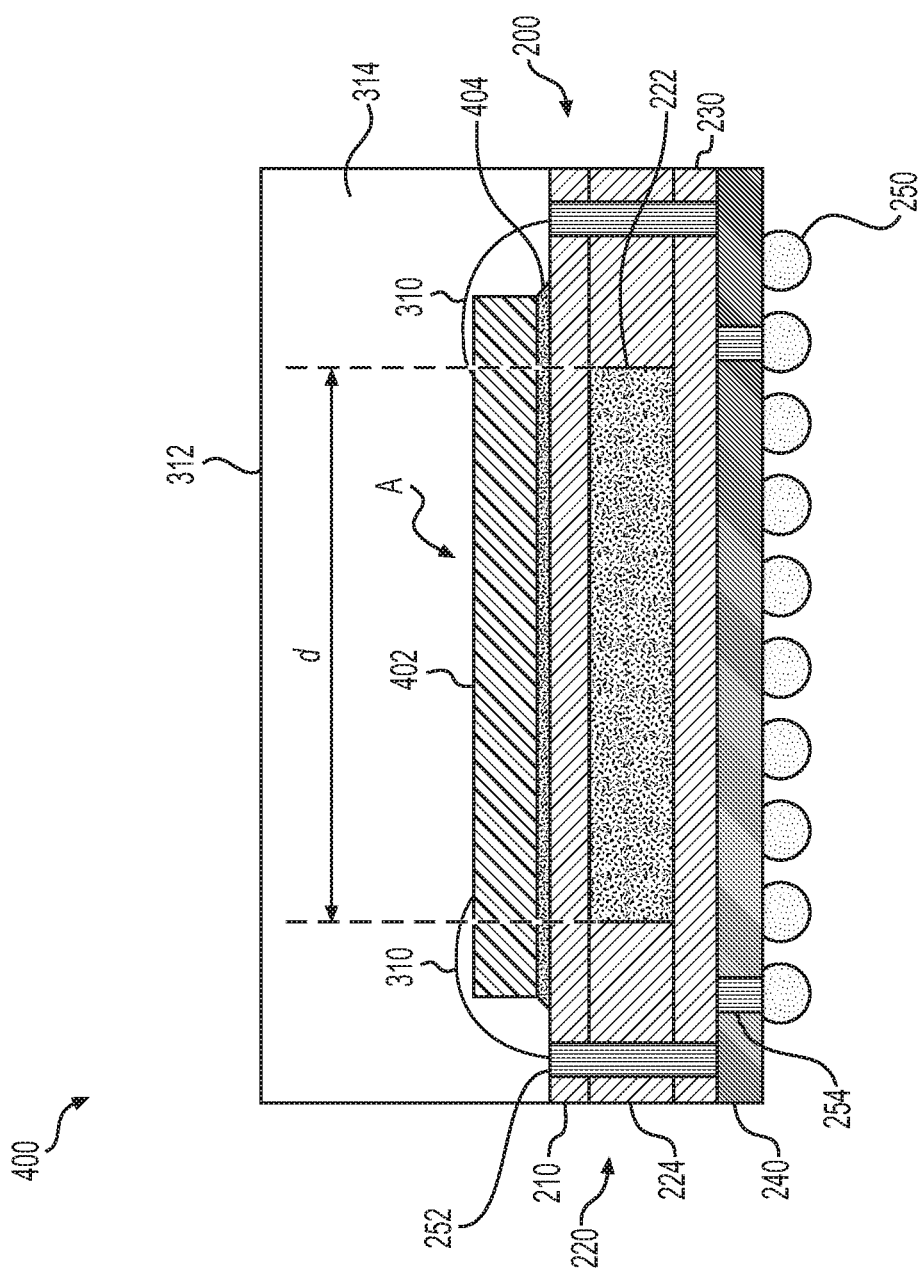
Figure 11:
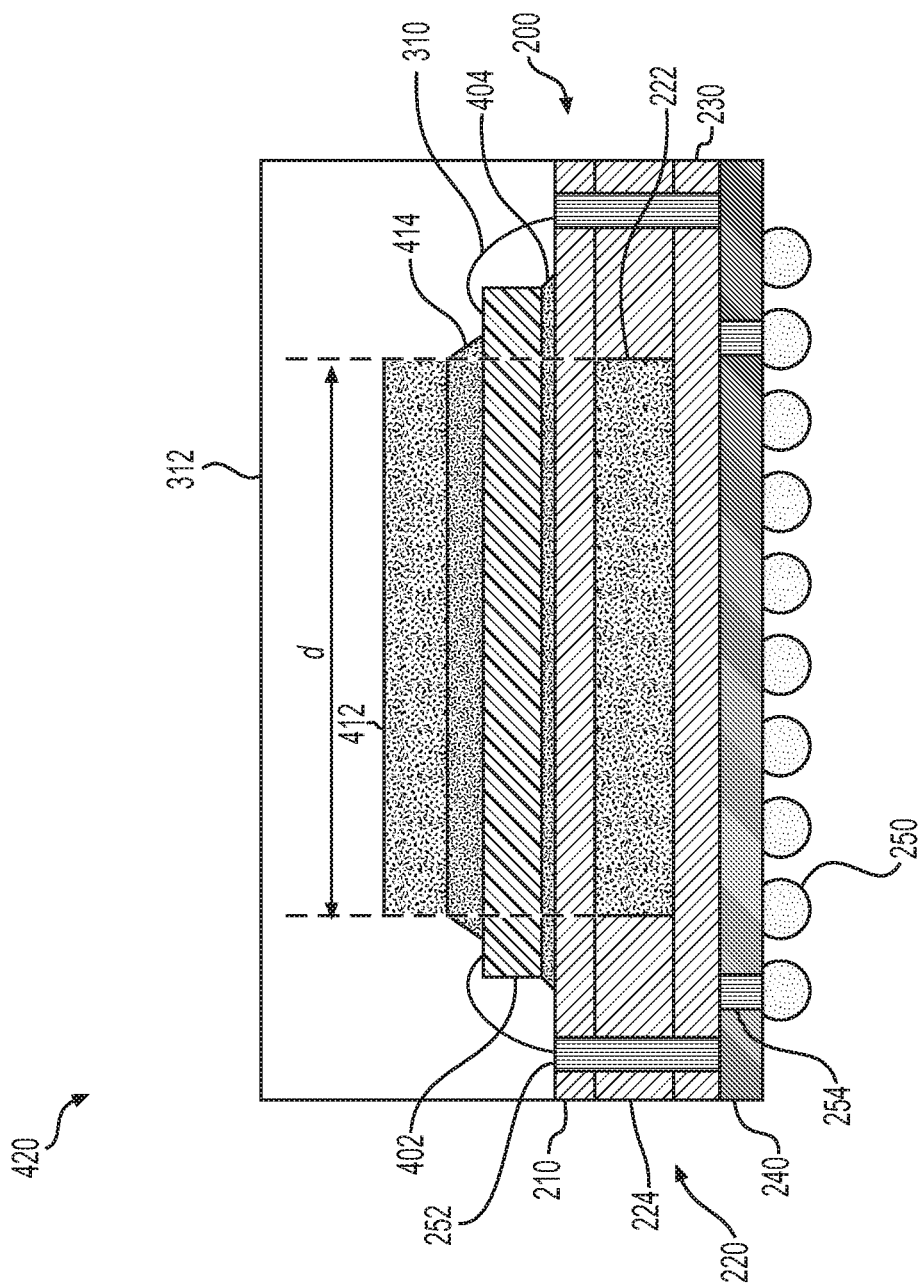

FIGS. 10-11 are schematic cross-sectional views of exemplary IC packages incorporating a multilayer frame package and other components, according to further embodiments of the present disclosure.

There are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

It should be noted that all numeric values disclosed herein (including all disclosed thickness values, limits, and ranges) may have a variation of ±10% (unless a different variation is specified) from the disclosed numeric value. For example, a layer disclosed as being "t" units thick can vary in thickness from (t−0.1t) to (t+0.1t) units. Further, all relative terms such as "about," "substantially," "approximately," etc. are used to indicate a possible variation of ±10% (unless noted otherwise or another variation is specified). Moreover, in the claims, values, limits, and/or ranges of the thickness and atomic composition of, for example, the described layers/regions, mean the value, limit, and/or range±10%.

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a process, method, article, or apparatus that uses such terms does not include only those steps, structure, or elements, but may include other elements and steps not expressly listed or inherent to such process, method, article, or apparatus. Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described. Moreover, the terms "a" and "an" herein do not denote a limitation of quantity, but rather denote the presence of at least one of the referenced item. Additionally, in this disclosure, a listed range is intended to cover both the end points (for example, a temperature range between about 400-500° C., as used herein, includes any temperature about ≥400° C. and about ≤500° C.).

In this disclosure, the term "region" is used generally to refer to one or more layers of material. That is, a region (as used herein) may include a single layer (or film or coating) of material or multiple layers or coatings (or films) of materials stacked one on top of another to form a multilayer system, such as, e.g., a multilayer frame for a semiconductor package. Further, although in the description below, the different regions in the disclosed stack/structure are sometimes referred to by specific names, this is only for ease of description and not intended as a functional description of the layer.

For the sake of brevity, conventional manufacturing techniques related to semiconductor packaging and/or processing may not be described in detail herein. The exemplary embodiments may be fabricated using known manufacturing techniques and processes, including, but not limited, lithographic, stamping. and/or adhesive processes.

With reference now to the figures, there are many inventions described and illustrated herein, as well as many aspects and embodiments of those inventions. In one aspect, the present disclosure is directed to a multilayer frame package for an integrated circuit (IC) die, wherein the package includes a magnetic shield incorporated or integrated within the multilayer package—e.g., disposed between two of the layers of the package, such as between layers 1 and 3 of a ball grid array (BGA) package.

An exemplary BGA package 100 is shown in FIGS. 1-2. A perspective schematic diagram of package 100 is provided in FIG. 1. A cross-sectional view of package 100 is depicted in FIG. 2. Package 100 may include an IC die 110. Die 110 may be a magnetoresistive semiconductor die functioning as, e.g., a magnetoresistive sensor or a magnetic memory. Die 110 may include an underlying magnetically sensitive circuit. Die 110 may be sensitive to internally induced magnetic fields and external magnetic fields. For example, die 110 may be a magnetoresistive memory device having an array of magnetic memory cells, such as an MRAM chip having an array of spin torque and/or magnetic tunnel junction ("MTJ") bits (not shown).

Die 110 may be wire bonded to a substrate 160 using interconnects 125. Interconnects 125 (e.g., wires) may connect contacts (or terminals) of die 110 to corresponding contacts on a top surface of substrate 160. As known in the art, electrical signals between the circuits on die 110 and contacts on substrate 160 are transferred through the interconnects 125.

Substrate 160 may include signal paths (not shown) (e.g., conductive lines, through-hole vias, etc.) that transfer signals from contacts of substrate 160 to a BGA 130 on the bottom side of substrate 160. As those of ordinary skill in the art will readily recognize, BGA is a surface mount technology where small electrically conductive solder balls are used to attach a package, including package 100, to a motherboard (or another interconnecting layer). These solder balls transfer signals from a die 110 to a motherboard or another interconnecting layer (not shown). Although FIGS. 1-2 illustrate a BGA 130 on the back side of the substrate, this is only exemplary. In general, any known method (e.g., pin grid array, land grid array, etc.) may be used to attach the package 100 to the motherboard. Contacts and/or balls of BGA 130 may be arranged in a matrix of, for example, dimensions N×N or N×M.

Die 110 may include an underlying magnetically sensitive circuit. Die 110 may be sensitive to internally induced magnetic fields and external magnetic fields. For example, die 110 may be a magnetoresistive memory device having an array of magnetic memory cells, such as an MRAM chip having an array of spin torque and/or magnetic tunnel junction ("MTJ") bits (not shown). Elements of die 110 may have in-plane anisotropy. As described below, shields (e.g., top and/or bottom shields 150, and/or 140) may be positioned on the front and back sides of die 110 to protect its electrical circuits from external magnetic fields. Shields 140, 150 may also protect other devices (e.g., devices external to die 110) from any internal magnetic fields generated by die 110.

Die 110 may be attached to the substrate 160 via a bottom shield 140. The back side of die 110 may be attached to one side of bottom shield 140, and the opposite side of bottom shield 140 may be attached to the top side of substrate 160. A first adhesive 145 (e.g., die attach film, epoxy adhesive, etc.) may be used to attach die 110 to bottom shield 140 and a second adhesive 165 may be used to attach bottom shield 140 to substrate 160. In general, any type of adhesive may be used as the first and second adhesives 145, 165. First and second adhesives 145, 165 may be the same or different materials. In one embodiment, one or both of first and second adhesives 145, 165 may be an electrically non-conductive epoxy or paste and/or an adhesive film. In embodiments where an adhesive such as adhesives 145, 165 is an epoxy, the epoxy may be dispensed between the adherents in any manner (e.g., screen printed, needle deposited, etc.). In some embodiments, one or more of first and second adhesives 145, 165 may be a B-Stage DAF tape and/or a direct epoxy die attach, or any suitable combination thereof.

The top side of die 110 may also include a top shield 150 to protect die 110 from external magnetic fields. Top shield 150 may have any of the properties of bottom shield 140, described above. Top shield 150 may be attached to a top side of die 110 using adhesive 155. Adhesive 155 may have any of the properties of adhesives 145, 165, described above. In an alternative to a separate top shield 150, a top shield may be formed from molding material, such as molding material 170, as described below.

Package 100, including bottom shield 140 and top shield 150, may be encapsulated with a molding material 170 (e.g., a plastic or suitable (e.g., insulating material) using a molding process.

Although the description herein relates to a package for a ball grid array (BGA) semiconductor package, those of ordinary skill in the art will readily recognize that the principles described herein are applicable An exemplary multilayer frame package 200 for a ball grid array (BGA) package is illustrated in FIGS. 3A and 3B. In FIG. 3A, a cross-section of multilayer frame package 200 is shown along line B-B depicted in FIG. 3B, which shows a top plan view of the multilayer frame package 200. Multilayer frame package 200 may have a plurality of layers including, for example, a top layer 210, a magnetic shield layer 220, and a bottom layer 230. Although only three (3) layers are depicted, those of ordinary skill in the art will readily recognize that the multilayer frame packages of the present disclosure may include any suitable number of layers and that the layers may include any suitable configuration and/or materials. Layers or components of layers of multilayer frame package 200 may be made from any suitable material (e.g., fiberglass).

Magnetic shield layer 220 may include a magnetic shield 222 and a sub-frame 224. Magnetic shield 222 may be made from any material that shields an IC die from adverse (e.g., external) magnetic fields. For example, magnetic shield 222 may include soft magnetic or high permeability materials. Such materials may include, by way of example, nickel, cobalt, iron, and/or alloys including nickel, cobalt, and/or iron. For example, magnetic shield 222 may include nickel-iron or a nickel-iron based alloy such as a mu metal. As a further example, magnetic shield 222 may be made from an alloy such as NiFe 45/55. A thickness of magnetic shield 222 and/or magnetic shield layer 220 may be less (e.g., 50% less) than shield layers employing other materials (e.g., NiFe 80/20). Magnetic shield 222 may be, for example, in a foil or film form. Such a foil or film may have a thickness ranging from approximately 1 to approximately 1000 micrometers, more specifically ranging from approximately 25 to approximately 300 micrometers, and even more specifically ranging from approximately 50 and approximately 150 micrometers. Magnetic shield layer 220 may be disposed and/or incorporated between layers of multilayer frame package 200 during manufacture. For example, magnetic shield layer 220, including magnetic shield 222, may be secured between layers of multilayer frame package 200 using an adhesive (e.g., an epoxy or glue) during manufacture. An adhesive may be applied only to the sub-frame portion 224 of magnetic shield layer 220. In the alternative, an adhesive may be applied only to magnetic shield 222 of magnetic shield layer 220. In a further alternative, an adhesive may be applied to both magnetic shield 222 and sub-frame 224 of magnetic shield layer 220. In some embodiments, the adhesive may be applied to an entirety or a portion of magnetic shield 222 and/or sub-frame 224. The same adhesive may be applied to magnetic shield 222 and sub-frame 224. In the alternative, a different adhesive may be applied to magnetic shield 222 than to sub-frame 224. In addition or in the alternative, magnetic shield layer 220 may be secured between layers of multilayer frame package 200 via compressive and/or frictional forces. When compressive and/or frictional forces are used to secure magnetic shield layer 220, magnetic shield 222, and/or sub-frame 224, an adhesive may or may not be conjunctively used, in any of the manners described above.

Magnetic shield 222 may be attached to or otherwise disposed within an inner portion of sub-frame 224 (which may be, for example, hollow) and/or in a cavity of sub-frame 224. Sub-frame 224 may have dimensions (e.g., an outer dimension) that are the same as or similar to the size of one, more than one, or all of the other layers of multilayer frame package 200. For example, sub-frame 224 may have a same length, width, and/or thickness as some or all of the layers of multilayer frame package 200. Sub-frame 224 may be made of material which is the same as or similar to the material of other layers of multilayer frame package 200 (e.g., top layer 210 and/or bottom layer 230). Thus, environmental, thermal (e.g., thermal expansion), and other responses of the various layers of the multilayer frame package 200, including magnetic shield layer 220, may be substantially or sufficiently similar to other portions of multilayer frame package 200.

Multilayer frame package 200 may be mounted on a substrate 240. A ball grid array (BGA) 250 may be on the bottom side of substrate 240. Although FIG. 3A illustrates a BGA 250 on the back side of the substrate 240, this is only exemplary. In general, any known method (e.g., pin grid array, land grid array, etc.) may be used to attach a package including a multilayer frame package 200 to a motherboard or other interconnecting layer.

Multilayer frame package 200 may include a plurality of metal interconnects or vias 252, which may be made of any suitable material, including, e.g., Copper (Cu). In some embodiments, the vias 252 may include any suitable transition metal, such as, e.g., ruthenium (Ru). Vias 252 may route, for example, electrical signals, power, ground, etc. between an IC die (not shown) and one or more contacts or balls of BGA 250. Such signals may be routed through interconnects or vias 254 in substrate 240. Vias 252 may be routed in only the sub-frame 224 portion of magnetic shield layer 220. In other words, the wiring and/or routing within the sub-frame 224 of magnetic shield layer 220 may be configured so as to avoid or not electrically connect with the magnetic shield 222 of the magnetic shield layer 220. Therefore, the magnetic shield layer 222 may not interact with the conductors or electrical signal routing in the layers of the multilayer frame package 200, and a small size and/or compactness of multilayer frame package 200 may be maintained during construction of multilayer frame package 200.

During manufacture of multilayer frame package 200, each layer of the plurality of layers (including magnetic shield layer 220) may be fixed or secured (e.g., by adhesive) to the other layer(s) of multilayer frame package 200. Metal interconnects or vias 252, as described above, may be provided within multilayer frame package 200. Such vias 252 may route through the plurality of layers of the multilayer frame package 200 between an IC die (not shown) and one or more contacts or balls 250. The total thickness of multilayer frame package 200, including magnetic shield layer 220, may be the same or substantially the same as a standard BGA package. Such size may be maintained notwithstanding the presence of magnetic shield layer 220. In other words, the dimensions (including thickness) of layers of multilayer frame package 200, including magnetic shield layer 220, may be designed such that multilayer frame package 200, when assembled, has dimensions which are similar to or the same as the dimensions of a standard BGA package.

As shown in FIG. 3C, multilayer frame package 200 may include a plurality of magnetic shield layers, such as magnetic shield layers 220A and 220B. Each magnetic shield layer 220A, 220B may have one or more magnetic shields 222A, 222B and frames 224A, 224B. The plurality of magnetic shield layers 220A, 220B may include magnetic shields 222A, 222B which are fully overlapping or fully non-overlapping relative to the other magnetic shield layers when assembled in multilayer frame package 200. The plurality of magnetic shield layers 220A, 220B may additionally or alternatively include magnetic shields 222A, 222B which are partially overlapping and partially non-overlapping when assembled in multilayer frame package 200, as shown in FIG. 3C. The plurality of magnetic shield layers 220 may have one or more of the exemplary configurations descried below with regard to FIGS. 4A-4B, 5A-5B, 6A-6B, and 7A-7B. In the alternative, multiple multilayer frame packages may be used in assembling an IC package, such as the IC packages shown in FIGS. 8A-8B, 9A-9B, and 10-11. In a further alternative, a single magnetic shield layer 220 may include multiple magnetic shields 222, which may have any of the following configurations: fully overlapping, fully non-overlapping, partially overlapping, or partially non-overlapping.

An exemplary magnetic shield layer 220 is shown in FIGS. 4A-4B. Magnetic shield layer 220 may have any of the properties discussed above with regard to FIGS. 3A-3C. With respect to FIG. 4A, a cross-section of magnetic shield layer 220 is shown along line C-C depicted in FIG. 4B, which shows a plan view of magnetic shield layer 220 from above. As discussed above, magnetic shield layer 220 may include a magnetic shield 222 and a sub-frame 224. Magnetic shield layer, including magnetic shield 222 and/or sub-frame 224 may have a thickness I. As discussed above, thickness I may be such that a total thickness of multilayer frame package 200, including magnetic shield layer 220, may be the same or substantially the same as a standard BGA package. Such size may be maintained notwithstanding the presence of magnetic shield layer 220.

Sub-frame 224 may have an outer perimeter 226 and an inner perimeter 228. Magnetic shield 222 may lay or otherwise be disposed within inner perimeter 228. That is, magnetic shield 222 may be completely within an inner portion of sub-frame 224 defined by inner perimeter 228. For example, magnetic shield 222 may be secured to inner perimeter 228 by an adhesive (e.g., epoxy or glue). Magnetic shield 222, which may be, for example, a foil or film, may be disposed in and/or abut inner perimeter 228 and be fixed to inner perimeter 228 of magnetic shield layer 220 of multilayer frame package 200. In some embodiments, one or more projections and/or retaining features (e.g., cavities) (not shown) may be provided an a surface of inner perimeter 228. The projections and/or retaining features may cooperate with magnetic shield 222 (or cooperating features (not shown) on magnetic shield 222) to assist in retaining magnetic shield 222 within inner perimeter 228.

Inner perimeter 228 and outer perimeter 226 may have any suitable shape. Inner perimeter 228 may define an inner cavity of any shape which may house magnetic shield 222. For example, inner perimeter 228 may define a rectangular, square, ovular, circular, or polygonal inner cavity. As shown in FIGS. 4A and 4B, both outer perimeter 226 and inner perimeter 228 may have a rectangular shape. The dimensions of outer perimeter 226 and inner perimeter 228 may be proportional to one another. That is, a shape formed by outer perimeter 226 may be similar to a shape formed by inner perimeter 228. In the alternative, the dimensions of outer perimeter 226 and inner perimeter 228 may be disproportionate to one another. A distance d between outer perimeter 226 and inner perimeter 228 may be uniform or non-uniform about the periphery of sub-frame 224. The length of inner perimeter 228 may differ from the width of inner perimeter 228. That is, inner perimeter 228 may form a rectangular shape. In the alternative, the length and width of inner perimeter 228 may be the same so that inner perimeter 228 forms a square shape.

A further exemplary magnetic shield layer 220 is shown in FIGS. 5A-5B. Magnetic shield layer 220 may have any of the properties discussed above with regard to FIGS. 3 and 4A-4B. Turning to FIG. 5A, a cross-section of magnetic shield layer 220 is shown along line D-D in FIG. 5B, which shows a plan view of magnetic shield layer 220 from above. As with the exemplary configuration shown in FIGS. 4A and 4B, sub-frame 224 of magnetic shield layer 224 may have an outer perimeter 262 and an inner perimeter 264. Outer perimeter 262 may have the same qualities as outer perimeter 226, as discussed with regard to FIGS. 4A and 4B. As with inner perimeter 228, described with regard to FIGS. 4A and 4B, inner perimeter 264 may have a rectangular shape. However, inner perimeter 264 may have different dimensions than inner perimeter 228. For example, a distance d in between outer perimeter 262 and inner perimeter 264 may be larger than distance d between outer perimeter 226 and inner perimeter 228. In other words, inner perimeter 264 may have a different width and/or length than inner perimeter 228. Dimensions of outer perimeter 262 may be the same as dimensions of outer perimeter 226. In the alternative, the dimensions of outer perimeter 262 may differ from the dimensions of outer perimeter 226.

Another exemplary magnetic shield layer 220 is shown in FIGS. 6A-6B. Magnetic shield layer 220 may have any of the properties discussed above with regard to FIGS. 3, 4A-4B, and 5A-5B. With regard to FIG. 6A, a cross-section of magnetic shield layer 220 is shown along line E-E of FIG. 6B, which shows a plan view of magnetic shield layer 220 from above. Sub-frame 224 of magnetic shield layer 220 may have an outer perimeter 266 and an inner perimeter 268. Outer perimeter 266 may have any of the characteristics of outer perimeters 226 and 262, as discussed with regard to FIGS. 4A-4B and 5A-5B, and inner perimeter 268 may have any of the characteristics of inner perimeters 228 and 264, as discussed with regard to FIGS. 4A-4B and 5A-5B. Inner perimeter 268 may have a round or oval shape. For example, inner perimeter 268 may have an oval shape. As shown in FIG. 6B, a distance d between a vertex of inner perimeter 268 and outer perimeter 266 may be larger than a distance d' between a co-vertex of inner perimeter 268 and outer perimeter 266. The configuration shown is merely exemplary. As discussed above, magnetic shield 222 may lay within inner perimeter 268. That is, magnetic shield 222 may be completely within an inner portion of sub-frame 224 defined by inner perimeter 268. In some embodiments, magnetic shield 222 may be secured to inner perimeter 268 by an adhesive (e.g., epoxy or glue). Magnetic shield 222, which may be, for example, a foil or film, may be disposed in and/or abut inner perimeter 268 and be fixed to inner perimeter 268 of magnetic shield layer 220 of multilayer frame package 200.

Yet another exemplary magnetic shield layer 220 is shown in FIGS. 7A-7B. Magnetic shield layer 220 may have any of the properties discussed above with regard to FIGS. 3, 4A-4B, 5A-5B, and 6A-6B. FIG. 7A shows a cross-section of magnetic shield layer 220 along line F-F of FIG. 7B, which shows a plan view of magnetic shield layer 220 from above. Sub-frame 224 of magnetic shield layer 220 may have an outer perimeter 272 and an inner perimeter 274. Outer perimeter 272 may have any of the characteristics of outer perimeters 226, 262, and 266, as discussed with regard to FIGS. 4A-4B, 5A-5B, and 6A-6B, and inner perimeter 274 may have any of the qualities of inner perimeters 228, 264, and 268, as discussed above with regard to FIGS. 4A-4B, 5A-5B, and 6A-6B. Inner perimeter 274 may have a round or oval shape. For example, inner perimeter 274 may have an oval shape, such as, e.g., an elongated oval. In contrast with inner perimeter 268, as described with regard to FIG. 6B, a distance d between a vertex of inner perimeter 274 and outer perimeter 272 may be smaller than a distance d' between a co-vertex of inner perimeter 274 and outer perimeter 272. That is, an oval formed by inner perimeter 274 may be relatively more oblong than an oval formed by inner perimeter 268. A distance d between a vertex of inner perimeter 274 and outer perimeter 272 may also be the same as a distance d' between a co-vertex of inner perimeter 274 and outer perimeter 272. Inner perimeter 268 may also form a circular, rather than an ovular, shape. The configuration shown is merely exemplary.

An exemplary semiconductor package 300 is shown in FIG. 8A, according to one aspect of the present disclosure. An exemplary method 299 for constructing the exemplary semiconductor package 300 is shown in FIG. 8B. Semiconductor package 300 may include a multilayer frame package 200 as described above, as well as a substrate 240 and BGA 250. Multilayer frame package 200 may be fabricated in step 301 of FIG. 8B. As discussed above, multilayer frame package 200 may include vias 252, and substrate 240 may include vias 254. Presence of one or more magnetic shield layers 220 in multilayer frame package 200 may facilitate a reduction in any deformations of multilayer frame package 200 and/or semiconductor package 300 during solder reflow (e.g., when semiconductor package 300 and/or multilayer frame package 200 is fixed to a printed circuit board (PCB) or similar structure) and may add a thermal mass that may assist in the process of wave solder.

In step 303 (FIG. 8B), an IC die 302 (made of, e.g., plastic) may be disposed on, over, fixed, and/or otherwise provided adjacent to top layer 210 of multilayer frame package 200 via an adhesive 304 (e.g., epoxy or glue). IC die 302 may include, for example, magnetoresistive devices (e.g., MRAM, an embedded MRAM, a magnetoresistive sensor, and/or a magnetoresistive transducer) thereon and/or therein. Such magnetoresistive devices may be magnetic tunnel junction stacks and/or structures having, for example, in-plane anisotropy.

Bond wires 310 may be attached to IC die 302 and to multilayer frame package 200 in step 311 (FIG. 8B). Bond wires 310 may provide an electrical connection between bond pads or circuitry disposed or fabricated in/on IC die 302 and vias 252. Vias 252 may be configured to route signals to one or more balls/contacts (such as BGA 250) via, for example, vias 254. As described above, electrical connectors forming vias 252 in multilayer frame package 200 may be routed within multilayer frame package 200 so as to avoid or not electrically connect with magnetic shield 222 of magnetic shield layer 220. For example, vias 252 may be routed through sub-frame 224 and not through magnetic shield 222. Therefore, magnetic shield 222 of magnetic shield layer 220 may not interfere or interact with signal routing in any of the other layers of multilayer frame package 200 or semiconductor package 300.

Because multilayer frame package 200 may already incorporate magnetic shield 222, utilizing multilayer frame package 200 may eliminate steps of having to attach an IC die such as IC die 302 to a magnetic shield and of having to attach a magnetic shield to a separate frame. Instead, multilayer frame package 200, including shield layer 220 having magnetic shield 222, can be disposed on a substrate 240, and IC die 302 can be placed directly onto multilayer frame package 200 via, e.g., an adhesive 340. Since manufacturing issues or irregularities may arise during the manufacturing steps of attaching an IC die, such as IC die 302, to a magnetic shield or attaching a magnetic shield to a frame, eliminating this manufacturing step may produce more consistent manufacturing results. For example, thermal delamination may be less likely because of consistency in materials (e.g., fiberglass) used across the layers of multilayer frame package 200. In step 313 (FIG. 8B), an encapsulate cover 312 (made of, e.g., plastic) may be formed over the IC die 302, bond wires 310, and top layer 210 of multilayer frame package 200 to seal the structure of semiconductor package 300. Encapsulate cover 312 may also encompass other components. For example, package 300 may include multiple IC dies or numerous passive components, including inductors, capacitors, and resistors. Package 300 may be a system-in-package (SiP).

Cover 312 may protect IC die 302 and bond wires 310 from the environment. In other words, cover 312 may hermetically seal semiconductor package 300. Cover 312 may also protect IC die 302 and bond wires 310 from inadvertent damage. In addition, or in the alternative, to encapsulate cover 312, a molding compound may be used to encase or otherwise encapsulate IC die 302, bond wires 310, and/or top layer 210 of multilayer frame package 200. For example, a molding compound may fill cavity 314. A molding compound used may be magnetically conductive and electrically insulating, and it may be formed from any suitable material. Encapsulation with a molding compound may be performed according to any known method (including, e.g., a transfer molding process). If appropriate, encapsulated package 300 may be subject to a curing process to solidify the molding compound. A molding compound encapsulating package 300 may also have shielding properties. In a further alternative, a cavity 314 may be filled with an insulating compound or other suitable material, which may be disposed (e.g., by injection molding, transfer molding, etc.) around IC die 302, bond wires 310 and/or top layer 210 of multilayer frame package 200 prior to forming cover 312.

A further exemplary semiconductor package 320 is shown in FIG. 9A, and an exemplary method 321 for constructing semiconductor package 320 is depicted in FIG. 9B. Semiconductor package 320 may have any of the properties of semiconductor package 300 described above in connection with FIG. 8A. Method 321 may have any of the steps of method 299 (FIG. 8B). Semiconductor package 320 may also include a second magnetic shield 322. In step 325 (FIG. 9B), second magnetic shield 322 may be disposed, affixed, and/or otherwise provided adjacent to a side of IC die 302 opposite to multilayer frame package 200 via an adhesive 324 (e.g., epoxy or glue). Second magnetic shield 322 may function to protect structures or circuitry in IC die 302 against spurious magnetic fields from a top (or other) direction. Second magnetic shield 322 may be disposed on and/or affixed to a second side of IC die 302 via an adhesive 324 after IC die 302 is attached to top layer 210 of multilayer frame package 200, and after the electrical pads on IC die 302 are connected to vias 252 (e.g., via bond wires 310). In some embodiments, second magnetic shield 332 may be disposed in a multilayer structure, as described with regard to multilayer frame package 200. In the alternative, second magnetic shield 332 may take the form of any now known or later developed magnetic shield. After second magnetic shield 322 is disposed on and/or affixed to a second side of IC die 302, in step 327 (FIG. 9B), encapsulate 312 (formed of, e.g., molded plastic) may be formed over magnetic shield 322, IC die 302, and multilayer frame package 200 to seal the structure. As described above, encapsulate 312 may protect IC die 302 and/or bond wires 310 from the environment. In addition or in the alternative, as described above with regard to FIG. 8A, a molding compound and/or insulating compound may be used to encapsulate elements of semiconductor package 300. Such a molding compound and/or insulating compound may have shielding effects in addition to or in the alternative to second magnetic shield 322. For example, encapsulate 312 may include one or more filler materials configured to shield IC die 302 from extraneous magnetic fields.

Another exemplary semiconductor package 400 is shown in FIG. 10. Still another exemplary semiconductor package 420 is shown in FIG. 11. Semiconductor packages 400 and 420 may have any of the properties of semiconductor packages 300 and 320, as described with regard to FIGS. 8A-8B and 9A-9B. Semiconductor packages 400 and 420 may include an IC die 402 affixed to multilayer frame package 200 with adhesive 404 (e.g., epoxy or glue). IC die 402 may have any of the properties of IC die 302, as described above. As shown in FIG. 10, semiconductor package 400 does not have a second magnetic shield, while, as shown in FIG. 11, semiconductor package 420 may have a second magnetic shield 412 affixed to multilayer frame package 200 using an adhesive 414 (e.g., epoxy or glue).

As shown in FIG. 10, a magnetic shield 222 of magnetic shield layer 200 may have a width d. That is, an inner perimeter of sub-frame 224 may have a width d. Width d may be equal or similar (e.g., ±10%) to the width of the active area "A" of IC die 402 or the width of the area of the magnetically-sensitive or critical area of IC die 402 (e.g., the MRAM array portion of a discrete or embedded MRAM IC). A magnetic shield layer 200 may also have a length (not shown) which may be equal or similar (e.g., ±10%) to the length of the active are of IC die 402 or the length of the area of the magnetically-sensitive or critical area of IC die 402 (e.g., the MRAM array portion of a discrete or embedded MRAM IC). Reduction in width and/or length of magnetic shield 222 may result in a corresponding increase in distance between an outer perimeter and an inner perimeter of sub-frame 224. Routing vias 252 and signals in multilayer frame package 200 may involve fewer constraints in such a scenario because avoiding or not electrically connecting with magnetic shield 222 of magnetic shield layer 220 may be easier when magnetic shield 222 occupies less area and/or when sub-frame 224 occupies a greater area. An increase in the area of sub-frame 224 may ease placement of vias 252 in sub-frame 224

Although various embodiments of the present disclosure have been illustrated and described in detail, it will be readily apparent to those skilled in the art that various modifications may be made without departing from the present disclosure or from the scope of the appended claims.

What is claimed is:

1. An integrated circuit package comprising:
   a multilayer frame including:
      a top frame;
      a bottom frame; and
      a middle frame positioned between and attached to the top frame and the bottom frame, wherein the middle frame includes (a) a sub-frame defining a hollow region within a periphery of the sub-frame, and (b) a magnetic shield disposed in the hollow region;
   a substrate positioned below and attached to the bottom frame of the multilayer frame; and
   an integrated circuit die positioned above the top frame of the multilayer frame.

2. The integrated circuit package of claim 1, wherein the top frame, the bottom frame, and the sub-frame are made of the same material, and the magnetic shield is made of a different material.

3. The integrated circuit package of claim 1, further comprising interconnects routed through the bottom frame and the sub-frame.

4. The integrated circuit package of claim 1, wherein the magnetic shield includes a film or a foil, wherein the film or foil includes a thickness between 50 and 150 micrometers.

5. The integrated circuit package of claim 1, wherein the magnetic shield is fixed to an inner perimeter of the sub-frame.

6. The integrated circuit package of claim 1, wherein the hollow region of the sub-frame is rectangular-shaped.

7. The integrated circuit package of claim 1, wherein the hollow region of the sub-frame is oval-shaped.

8. The integrated circuit package of claim 1, wherein the sub-frame of the middle frame is a first sub-frame and the hollow region defined by the first sub-frame is a first hollow region, and wherein the middle frame further includes a second sub-frame defining a second hollow region within a periphery of the second sub-frame and including a magnetic shield layer disposed in the second hollow region, the first sub-frame being attached to the second sub-frame such that at least a portion of the first hollow region overlaps with at least a portion of the second hollow region.

9. The integrated circuit package of claim 1, wherein a width of the magnetic shield is substantially equal to or greater than a width of an active area of the integrated circuit die.

10. The integrated circuit package of claim 1, wherein the integrated circuit die includes a magnetoresistive device.

11. A multilayer frame for an integrated circuit package including:
    a top frame;
    a bottom frame;
    a middle frame positioned between and attached to the top frame and the bottom frame, wherein the middle frame includes (a) a sub-frame defining a hollow region within a periphery of the sub-frame, and (b) a magnetic shield disposed in the hollow region; and
    a plurality of electrically conductive vias extending from a top surface of the top frame to a bottom surface of the bottom frame through the sub-frame.

12. The multilayer frame of claim 11, wherein the top frame, the bottom frame, and the sub-frame are made of the same material, and the magnetic shield is made of a different material.

13. The multilayer frame of claim 11, wherein the magnetic shield includes a film or a foil, wherein the film or foil includes a thickness of approximately 50 to approximately 150 micrometers.

14. The multilayer frame of claim 11, wherein the magnetic shield is fixed to an inner perimeter of the sub-frame.

15. The multilayer frame of claim 11, wherein the hollow region of the sub-frame is one of rectangular-shaped or oval-shaped.

16. The integrated circuit package of claim 1, wherein the multilayer frame further includes a plurality of electrically conductive vias extending through the top frame, the sub-frame, and the bottom frame.

17. The integrated circuit package of claim 16, further including a plurality of bond wires connecting electrical contacts on the integrated circuit die with the plurality of electrically conductive vias of the multilayer frame.

18. An integrated circuit package comprising:
a multilayer frame including:
  a top frame;
  a bottom frame;
  a middle frame positioned between and fixed to the top frame and the bottom frame, wherein the middle frame includes (a) a sub-frame defining a hollow region within a periphery of the sub-frame, and (b) a magnetic shield positioned in the hollow region, and wherein the top frame, the bottom frame, and the sub-frame are made of a same material, and the magnetic shield is made of a different material; and
  a plurality of electrically conductive vias extending from a top surface of the top frame to a bottom surface of the bottom frame through the sub-frame;
a substrate positioned below the bottom surface of the bottom frame;
an integrated circuit die including a plurality of electrical contacts positioned above the top surface of the top frame; and
a plurality of bond wires connecting the plurality of electrical contacts of the integrated circuit die with the plurality of electrically conductive vias of the multilayer frame.

19. The integrated circuit package of claim 18, further including an encapsulate material covering the integrated circuit die, the plurality of bond wires, and at least a portion of the top surface of the top frame.

20. The integrated circuit package of claim 18, wherein the magnetic shield includes a film or a foil, and wherein the film or foil includes a thickness of approximately 50 to approximately 150 micrometers.

* * * * *